US012206969B2

(12) United States Patent
Patel et al.

(10) Patent No.: US 12,206,969 B2
(45) Date of Patent: Jan. 21, 2025

(54) SENSOR SHIFT FLEXURE ARRANGEMENTS FOR IMPROVED SIGNAL ROUTING

(71) Applicant: Apple Inc., Cupertino, CA (US)

(72) Inventors: Himesh Patel, Cupertino, CA (US); Phillip R Sommer, Newark, CA (US)

(73) Assignee: Apple Inc., Cupertino, CA (US)

( * ) Notice: Subject to any disclaimer, the term of this patent is extended or adjusted under 35 U.S.C. 154(b) by 133 days.

(21) Appl. No.: 17/818,813

(22) Filed: Aug. 10, 2022

(65) Prior Publication Data

US 2023/0056192 A1 Feb. 23, 2023

Related U.S. Application Data

(60) Provisional application No. 63/234,155, filed on Aug. 17, 2021.

(51) Int. Cl.
*H04N 23/55* (2023.01)
*H04N 23/54* (2023.01)

(52) U.S. Cl.
CPC ............. *H04N 23/55* (2023.01); *H04N 23/54* (2023.01)

(58) Field of Classification Search
CPC ........ H04N 23/54; H04N 23/55; H04N 23/57; H05K 1/189; H05K 2201/0154; H05K 2201/10121; H05K 2201/10371; H05K 3/323
See application file for complete search history.

(56) References Cited

U.S. PATENT DOCUMENTS

| | | | | |
|---|---|---|---|---|
| 9,880,327 B2* | 1/2018 | Park | ...................... | H04N 23/63 |
| 10,523,135 B2* | 12/2019 | Ng | .......................... | H04N 23/55 |
| 2009/0263639 A1* | 10/2009 | Dunbar | ............... | C08G 73/1046 |
| | | | | 428/473.5 |
| 2020/0050014 A1* | 2/2020 | Park | ...................... | H04N 23/687 |
| 2021/0080807 A1* | 3/2021 | Sharma | .................. | G03B 13/36 |

FOREIGN PATENT DOCUMENTS

WO 2020036383 2/2020

* cited by examiner

*Primary Examiner* — Amy R Hsu
(74) *Attorney, Agent, or Firm* — Robert C. Kowert; Kowert, Hood, Munyon, Rankin & Goetzel, P.C.

(57) ABSTRACT

Various embodiments include sensor shift flexure arrangements for improved signal routing. For example, a camera with sensor shift actuation may include a flexure for suspending an image sensor from a stationary structure of the camera, and for allowing motion of the image sensor enabled by one or more actuators of the camera. The flexure may be configured to convey electrical signals between the image sensor and a flex circuit in some embodiments. According to some embodiments, the flexure may include a stack of layers comprising an electrical grounding portion that has an additional conductive layer adjacent to a base layer, which may reduce the overall resistivity of a ground current return path. In some embodiments, the flexure may additionally or alternatively include an impedance adjusting feature configured to adjust the impedance of an electrical signal pad used to connect the flexure with another component of the camera.

20 Claims, 9 Drawing Sheets

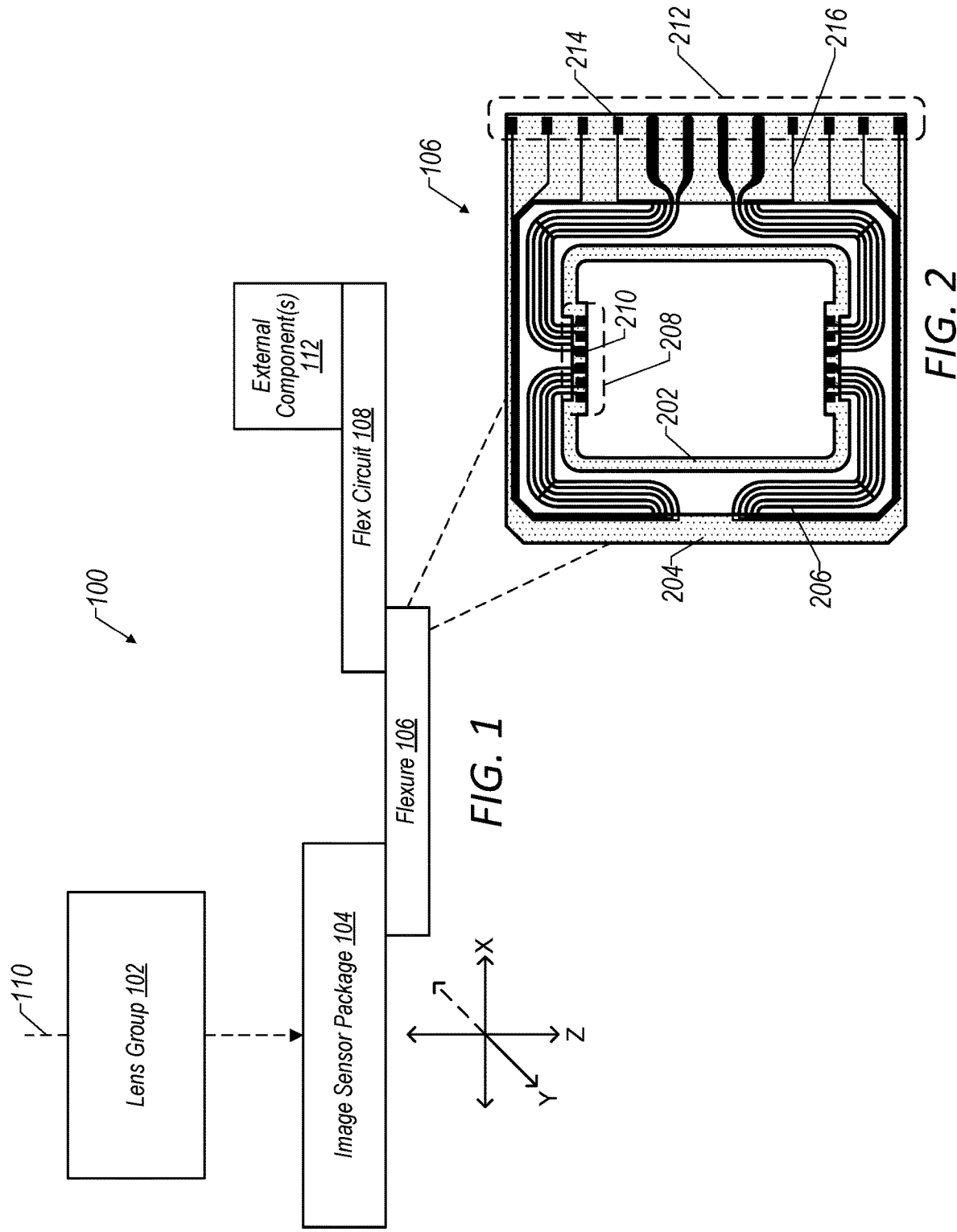

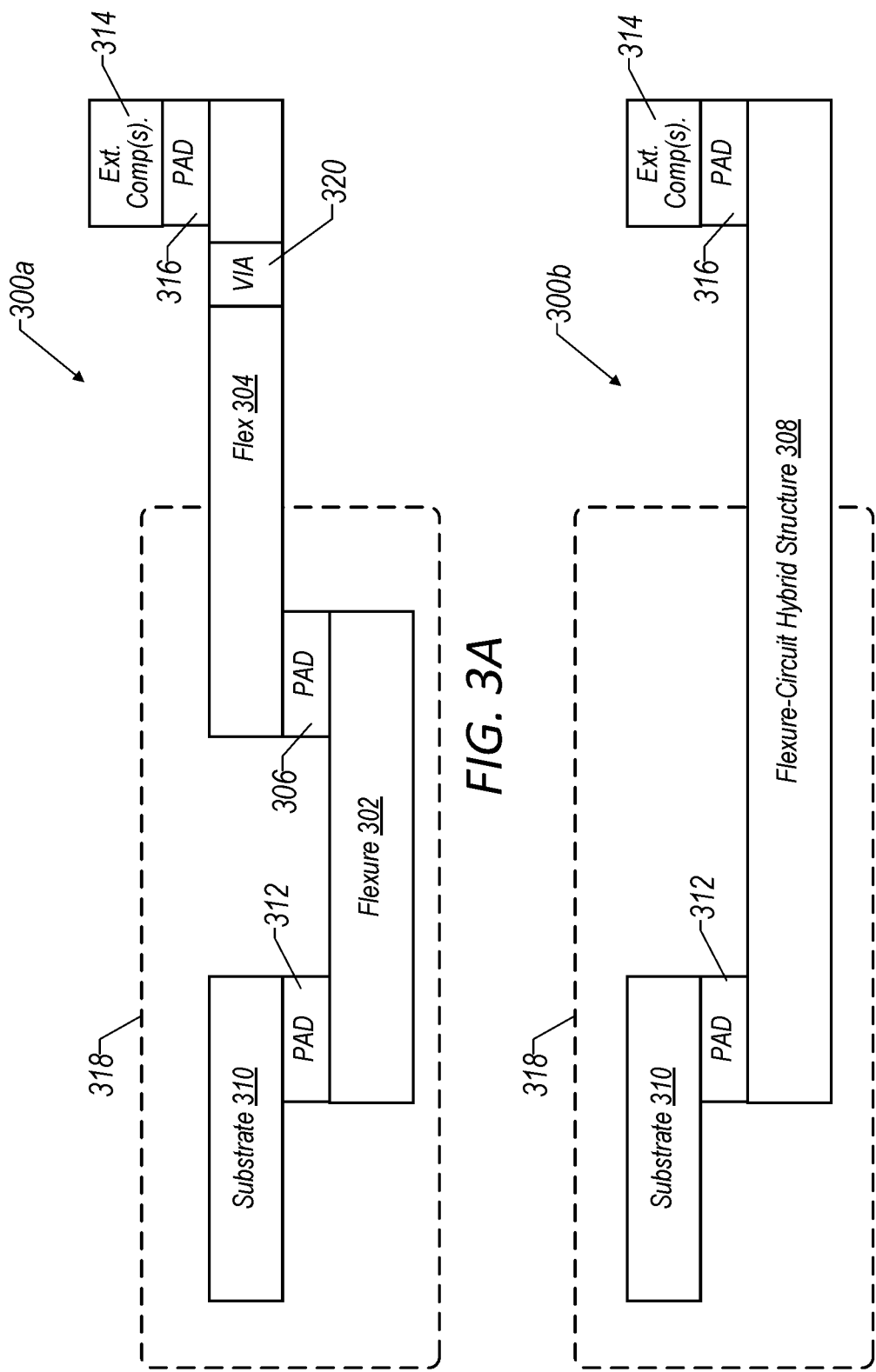

SENSOR SHIFT FLEXURE ARRANGEMENTS FOR IMPROVED SIGNAL ROUTING

This application is a claims benefit of priority to U.S. Provisional Application Ser. No. 63/234,155, filed Aug. 17, 2021, entitled "Sensor Shift Flexure Arrangements for Improved Signal Routing", which are hereby incorporated by reference herein in its entirety.

BACKGROUND

Technical Field

This disclosure relates generally to sensor shift flexure arrangements for improved signal routing.

Description of the Related Art

The advent of small, mobile multipurpose devices such as smartphones and tablet or pad devices has resulted in a need for high-resolution, small form factor cameras for integration in the devices. Some small form factor cameras may incorporate optical image stabilization (OIS) mechanisms that may sense and react to external excitation/disturbance by adjusting location of the optical lens on the X and/or Y axis in an attempt to compensate for unwanted motion of the lens. Some small form factor cameras may incorporate an autofocus (AF) mechanism whereby the object focal distance can be adjusted to focus an object plane in front of the camera at an image plane to be captured by the image sensor. In some such autofocus mechanisms, the optical lens is moved as a single rigid body along the optical axis of the camera to refocus the camera.

BRIEF DESCRIPTION OF THE DRAWINGS

FIG. 1 illustrates a schematic block diagram of an example camera system that may include a sensor shift flexure arrangement for improved signal routing, in accordance with some embodiments.

FIG. 2 illustrates a top view of example sensor shift flexure that may include a sensor shift flexure arrangement for improved signal routing, in accordance with some embodiments.

FIGS. 3A-3B illustrate schematic block diagrams of portions of example cameras that may include a sensor shift flexure arrangement for improved signal routing, in accordance with some embodiments. FIG. 3A shows a portion of an example camera including a flexure that is bonded to a flex circuit. FIG. 3B shows a portion of an example camera including a flexure-circuit hybrid structure.

FIG. 5A shows an example sensor shift flexure arrangement, comprising a stack of layers with a ground path that includes a base layer without an adjacent conductive layer. FIG. 5B shows another example sensor shift flexure arrangement, comprising a stack of layers with a ground path that includes a base layer and an additional conductive layer (e.g., adjacent the base layer), in accordance some embodiments.

FIG. 6A shows an example of a stack of layers that does not include an impedance adjusting feature.

FIGS. 6B-6D show other examples of stacks of layers, that include an impedance adjusting feature, in accordance with some embodiments.

Figure 4:
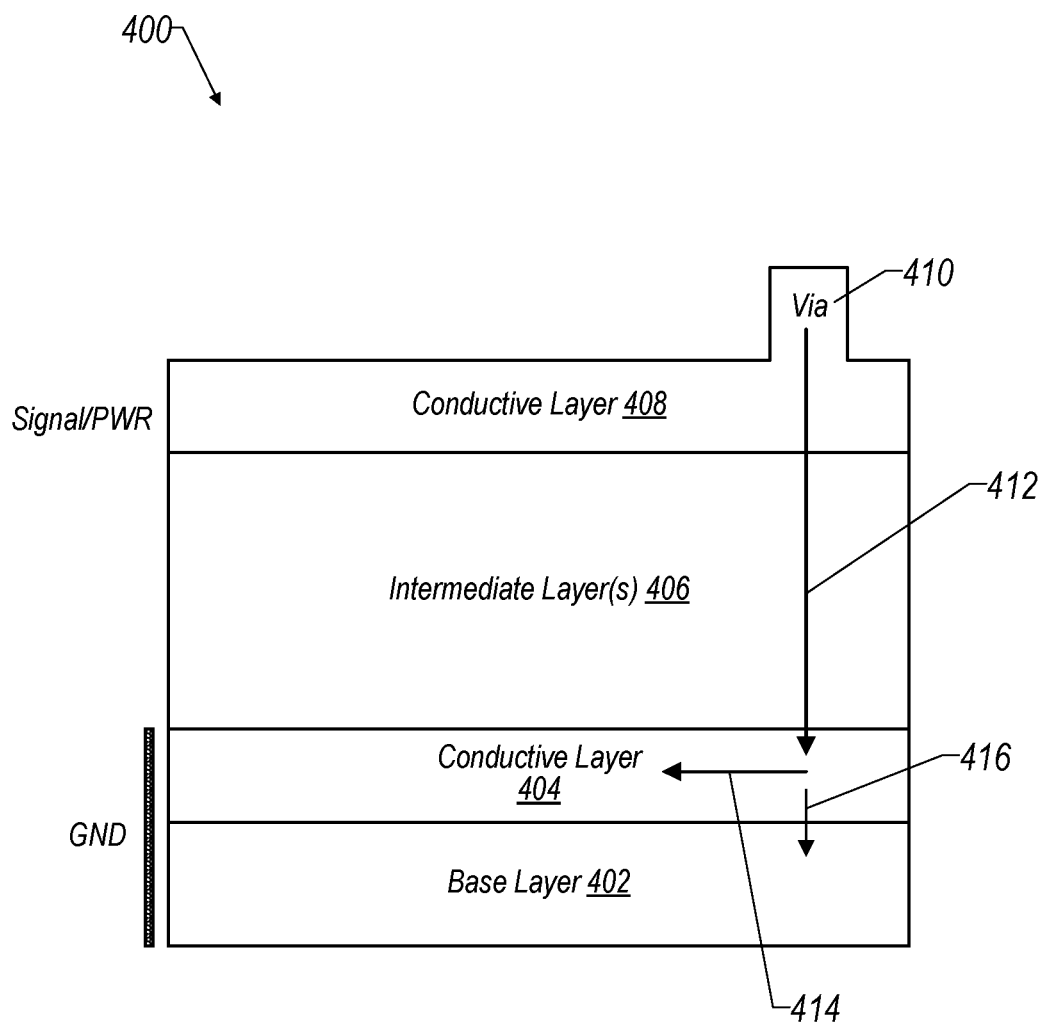
FIG. 4 illustrates a schematic diagram of an example sensor shift flexure arrangement for improved signal routing, in accordance with some embodiments.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units . . . ." Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112(f) for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

It will also be understood that, although the terms first, second, etc. may be used herein to describe various elements, these elements should not be limited by these terms. These terms are only used to distinguish one element from another. For example, a first contact could be termed a second contact, and, similarly, a second contact could be termed a first contact, without departing from the intended scope. The first contact and the second contact are both contacts, but they are not the same contact.

The terminology used in the description herein is for the purpose of describing particular embodiments only and is not intended to be limiting. As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

DETAILED DESCRIPTION

Various embodiments include sensor shift flexure arrangements for improved signal routing, e.g., in cameras with sensor shift actuation. For example, a camera system may include a lens group, an image sensor package, a flexure (which may include one or more aspects of the sensor shift flexure arrangements disclosed herein), and/or a flex circuit. Furthermore, the camera system may include one or more actuators (e.g., voice coil motor (VCM) actuator(s)). In some embodiments, the actuator(s) may be used to move the image sensor package relative to the lens group to provide autofocus (AF) and/or optical image stabilization (OIS) functionality. In various embodiments, the flexure may be used to suspend the image sensor package (e.g., from a base structure of the camera system) and to allow motion of the image sensor package enabled by the actuator(s). In some embodiments, the flexure may be coupled with the image sensor package and the flex circuit. The flexure may be configured to convey electrical signals between the image sensor package and the flex circuit. Furthermore, the flex circuit may be configured to convey electrical signals between the flexure and one or more external components that are external to the camera module.

In various embodiments, the flexure may include a stack of layers that are arranged so as to improve signal routing, relative to other camera systems that are arranged differently. As an example, the flexure may include an electrical grounding portion that has an additional conductive layer adjacent to a base layer, which may reduce the overall resistivity of ground and improve performance without impacting the mechanical stiffness requirements for sensor shift optical image stabilization (OIS). As another example, the flexure may additionally or alternatively include an impedance adjusting feature configured to increase the impedance of the electrical signal pad to a target impedance that is closer to the impedance of a signal trace, relative to an impedance of the electrical signal pad if the flexure did not include the impedance adjusting feature. In various embodiments a portion of the electrical grounding portion may define the impedance adjusting feature. In some embodiments, the impedance adjusting feature may comprise (i) a void or (ii) a cavity that is at least partially filled with an insulating material (e.g., epoxy).

Reference will now be made in detail to embodiments, examples of which are illustrated in the accompanying drawings. In the following detailed description, numerous specific details are set forth in order to provide a thorough understanding of the present disclosure. However, it will be apparent to one of ordinary skill in the art that some embodiments may be practiced without these specific details. In other instances, well-known methods, procedures, components, circuits, and networks have not been described in detail so as not to unnecessarily obscure aspects of the embodiments.

FIG. 1 illustrates a schematic block diagram of an example camera system 100 that may include a sensor shift flexure arrangement for improved signal routing, in accordance with some embodiments. According to various embodiments, the camera system 100 may include a lens group 102, an image sensor package 104, a flexure 106 (which may include sensor shift flexure arrangement), and/or a flex circuit 108. Furthermore, the camera system 100 may include one or more actuators (e.g., voice coil motor (VCM) actuator(s), as discussed herein with reference to FIG. 7). The lens group 102 may include one or more lens elements that define an optical axis 110. Additionally, or alternatively, the camera system 100 may have an optical axis that is orthogonal to an image plane defined by an image sensor (e.g., image sensor 704 in FIG. 7) in the image sensor package 104. The image sensor may receive light that has passed through the lens group 102 and/or one or more other lens elements of the camera system 100. Furthermore, the image sensor may be configured to convert the captured light to image signals.

In various embodiments, the actuator(s) may be configured to move the image sensor package 104 (also referred to herein as "sensor shift actuation") and/or the lens group 102. For example, the actuator(s) may be used to move the image sensor package 104 relative to the lens group 102 to provide autofocus (AF) and/or optical image stabilization (OIS) functionality. For example, the actuator(s) may be used to shift the image sensor package 104 in at least one direction parallel to the optical axis (e.g., in the Z-axis direction), to provide AF functionality in some embodiments. Additionally, or alternatively, the actuator(s) may be used to shift the image sensor package 104 in directions orthogonal to the optical axis 110 (e.g., in the x-axis and/or Y-axis directions), to provide OIS functionality in some embodiments. Additionally, or alternatively, the actuator(s) may be used to move the lens group 102 relative to the image sensor package 104 to provide AF and/or OIS functionality.

As further discussed with reference to FIGS. 2 and 3, the flexure 106 may be used to suspend the image sensor package 104 (e.g., from a base structure of the camera system 100) and to allow motion of the image sensor package 104 enabled by the actuator(s). In some embodiments, the flexure 106 may be coupled with the image sensor package 104 and the flex circuit 108, e.g., as indicated in FIG. 1. As discussed with reference to FIGS. 3A-3B, flexure 106 may be configured to convey electrical signals between the image sensor package 104 and the flex circuit 108. Furthermore, the flex circuit 108 may be configured to convey electrical signals between the flexure 106 and one or more external components 112 that are external to the camera module.

In various embodiments, the flexure 106 may include a stack of layers that are arranged so as to improve signal routing, relative to other camera systems that are arranged differently. As an example, the flexure 106 may include an electrical grounding portion that has an additional conductive layer adjacent to a base layer, which may reduce the overall resistivity of ground and improve performance without impacting the mechanical stiffness requirements for sensor shift optical image stabilization (OIS), as similarly discussed herein with reference to FIGS. 4-5B. As another example, the flexure 106 may additionally or alternatively include an impedance adjusting feature configured to increase the impedance of the electrical signal pad to a target impedance that is closer to the impedance of a signal trace, relative to an impedance of the electrical signal pad if the flexure did not include the impedance adjusting feature. In various embodiments a portion of the electrical grounding portion may define the impedance adjusting feature. In some embodiments, the impedance adjusting feature may comprise (i) a void or (ii) a cavity that is at least partially filled with an insulating material (e.g., epoxy), e.g., as similarly discussed herein with reference to FIGS. 6A-6B.

FIG. 2 illustrates a top view of example sensor shift flexure 106 that may include a sensor shift flexure arrangement for improved signal routing, in accordance with some embodiments. In various embodiments, the flexure 106 may include an inner frame 202, an outer frame 204, and/or one or more flexure arms 206. The inner frame 202 may be fixedly coupled with the image sensor (e.g., via the image sensor package 104). In some embodiments, the image sensor package 104 may include a substrate (e.g., substrate 310 in FIGS. 3A-3B, substrate 712 in FIG. 7, etc.) to which the image sensor is fixedly attached, and the substrate may be fixedly attached to the inner frame 202. The outer frame 204 may at least partially encircle the inner frame 202. The outer frame 204 may be fixedly coupled with a stationary structure (e.g., stationary structure 724 in FIG. 7) of the camera. The flexure arm(s) 206 may be connected to the inner frame 202 and to the outer frame 204, e.g., as indicated in FIG. 2. According to various embodiments, the flexure 106 may include electrical traces on at least a portion of the flexure arm(s) 206. The electrical traces may be configured to convey electrical signals between the inner frame 202 and the outer frame 204, and vice-versa. In various embodiments, different patterns of electrical traces may be routed from the inner frame 202 to the outer frame 204, and/or from the outer frame 204 to a flex circuit (e.g., flex circuit 304 in FIG. 3A). The electrical trace(s) may be insulated (e.g., via a dielectric layer and/or a cover layer) in various embodiments.

According to some embodiments, the flexure 106 may include one or more electrical signal pad regions, such as, but not limited to, electrical signal pad region 208 (e.g., comprising electrical signal pad 210) on the inner frame 202 and/or electrical signal pad region 212 (e.g., comprising electrical signal pad 214) on the outer frame 204. In various embodiments, electrical traces 216 may be routed on the inner frame 202, the flexure arm(s) 206, and/or the outer frame 204. According to various embodiments, electrical traces may be routed from the electrical signal pads on the inner frame 202 to the electrical signal pads on the outer frame 204, via the flexure arm(s) 206. In some embodiments, the electrical signal traces may follow routing paths that correspond to the paths of the flexure arm(s) 206 as they extend from the inner frame 202 to the outer frame 204. The electrical signal traces may be routed above and/or below the flexure arm(s) 206 in some embodiments. Additionally, or alternatively, the electrical signal traces may be at least partially embedded within the flexure arm(s) 206 in some embodiments.

FIGS. 3A-3B illustrate schematic block diagrams of portions of example cameras that may include a sensor shift flexure arrangement for improved signal routing, in accordance with some embodiments. FIG. 3A shows a portion of an example camera 300a including a flexure 302 that is attached to a flex circuit 304, e.g., via an electrical signal pad 306. FIG. 3B shows a portion of an example camera 300b including a flexure-circuit hybrid structure 308. In various embodiments, anisotropic conductive film (ACF) bonding may be used to attach components together; however, it should be appreciated that one or more other attachment processes (e.g., a surface-mount technology (SMT) attachment process, a hot bar bonding process, etc.) may additionally, or alternatively, be used for attachment of components in various embodiments.

As indicated in FIGS. 3A-3B, the cameras 300a and 300b may include a substrate 310 that is bonded to the flexure 302 (in FIG. 3A) or to the flexure-circuit hybrid structure 308 (in FIG. 3B), e.g., via electrical signal pad 412. The substrate 310 may be bonded to an image sensor (e.g., image sensor 704 in FIG. 7). In some embodiments, the image sensor and/or the substrate 310 may be included in the image sensor package 104 in FIG. 1. Instead of bonding a flexure to a flex circuit (as in FIG. 3A), the flexure-circuit hybrid structure 308 may be a single component that integrates structural and/or functional aspects of the flexure and the flex circuit, thus eliminating the need for the electrical signal pad (FIG. 3A).

In camera 300a, the flex circuit 304 may be bonded to one or more external components 314, e.g., via electrical signal pad 316. The flexure-circuit hybrid structure 308 in camera 300b may be bonded to external component(s) 314, e.g., via electrical signal pad 316. In FIGS. 3A-3B, the components (and/or portions of components) within broken rectangle 318 may be located within the corresponding camera module, while the components (and/or portions of components) outside of the broken rectangle 318 may be considered external to the camera module. The exterior component(s) 314 bonded to the flex circuit 304 (FIG. 3A) or to the flexure-circuit hybrid structure 308 (FIG. 3B) are shown as being outside of the broken rectangle 318 to indicate that the external component(s) 314 are external to the corresponding camera module.

Electrical signals may be routed between the image sensor and the external component(s) 314 at least partly via the flexure 302 (FIG. 3A) or the flexure-circuit hybrid structure 308 (FIG. 3B). For example, electrical signals may be routed along a path that includes the image sensor, an electrical signal pad (not shown) for interconnecting the image sensor with the substrate 310, the substrate 310, electrical signal pad 312, the flexure 302 (FIG. 3A) or the flexure-circuit hybrid structure 308 (FIG. 3B), electrical signal pad 306 (FIG. 3A), the flex circuit 304 (FIG. 3A), electrical signal pad 316, and the external component(s) 314, in that order from the image sensor to the external component(s) 314, and/or vice-versa. Additionally, or alternatively, the camera 300a may include a via 320 that is used to route electrical signals from one side (e.g., a bottom side) of the flex circuit 304 to the opposite side (e.g., a top side) of the flex circuit 304.

FIG. 4 illustrates a schematic diagram of an example sensor shift flexure arrangement 400 for improved signal routing, in accordance with some embodiments. In various embodiments, aspects of the sensor shift flexure arrangement 400 may be included in one or more portions of a sensor shift flexure (e.g., flexure 106 in FIGS. 1 and 2, flexure 302 in FIG. 3A, and/or flexure-circuit hybrid structure 308 in FIG. 3B, etc.). It is also contemplated that aspects of the sensor shift flexure arrangement 400 may be used in combination with aspects of one or more other embodiments of sensor shift flexure arrangements described herein. As a non-limiting example, aspects of the sensor shift flexure arrangement 400 may be used in combination with aspects of the sensor shift flexure arrangement described herein with reference to FIG. 6B.

In various embodiments, the sensor shift flexure arrangement 400 may comprise layers of material that are stacked in a direction orthogonal to an image plane of an image sensor, e.g., as indicated in the schematic diagram of layers 402-408. According to various embodiments, the stack-up of layers may include a base layer 402, a conductive layer 404 (also referred to herein as "first conductive layer"), one or more intermediate layers 406, and/or another conductive layer 408 (also referred to herein as a "second conductive layer"). In some embodiments, the second conductive layer may form one or more electrical traces used to convey electrical signals and/or power. Furthermore, the base layer 402 and the first conductive layer 404 may, together, comprise an electrical grounding portion that is used in a ground current return path, e.g., to carry a return current from the image sensor and/or an AF/OIS driver. For example, the sensor shift flexure arrangement 400 may include a via 410 that extends in a direction (as indicated by arrow 412) orthogonal to the image plane, to convey electrical current from the second conductive layer 408 to the electrical grounding portion (e.g., to the first conductive layer 404 and/or base layer 402, as indicated by arrows 414 and 416). In some non-limiting examples, the via 410 (and/or one or more other vias) may be located at the inner frame (e.g., inner frame 202 in FIG. 2) and/or the outer frame (e.g., outer frame 204 in FIG. 2) of the flexure. As a non-limiting example, the via 410 may be located in electrical signal pad region 208 indicated in FIG. 2. As another non-limiting example, the via 410 may be located in electrical signal pad region 212 indicated in FIG. 2.

Figure 5A:
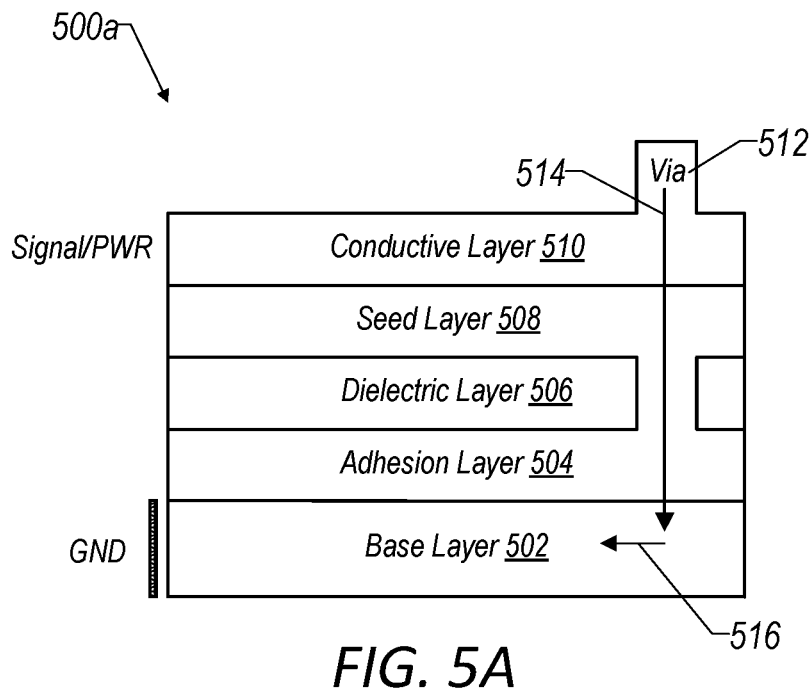
FIGS. 5A-5B illustrate schematic diagrams of example sensor shift flexure arrangements.

As will be discussed in further detail herein with reference to FIG. 5B, the first conductive layer 404 may comprise a material with a relatively high conductivity. The first conductive layer 404 may be used to reduce ground current resistance of the flexure, relative to the ground current resistance if the flexure were to use only the base layer 402, without the first conductive layer 404 (e.g., excluding the first conductive layer, as indicated in FIG. 5A) in the electrical ground current return path. In some embodiments, the intermediate layer(s) 406 may include one or more layers positioned, in the direction orthogonal to the image plane, between the first conductive layer 404 and the second conductive layer 408. As further discussed herein with reference to FIG. 5B, the intermediate layer(s) may include one or more adhesion layers (e.g., adhesion layer 522) and/or one or more dielectric layers (e.g., dielectric layer 524).

Figure 5B:
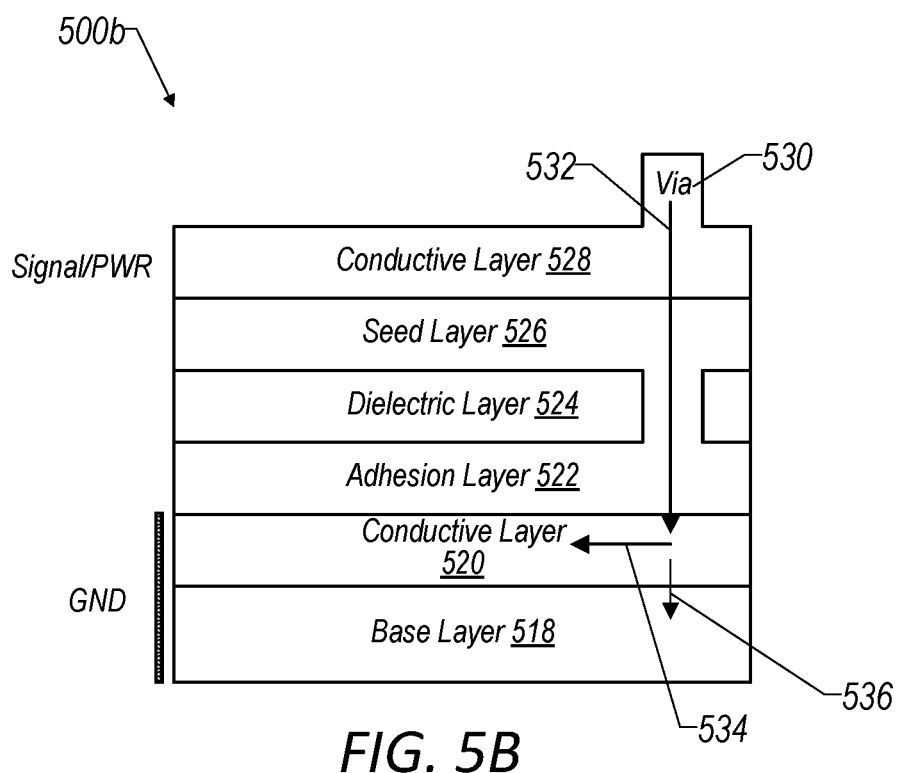

FIGS. 5A-5B illustrate schematic diagrams of example sensor shift flexure arrangements. FIG. 5A shows an example sensor shift flexure arrangement 500a comprising a stack of layers with a ground path that includes a base layer without an adjacent conductive layer. FIG. 5B shows another sensor shift flexure arrangement 500b, comprising a stack of layers with a ground path that includes a base layer and an additional conductive layer (e.g., adjacent the base layer), in accordance some embodiments.

Figure 7:
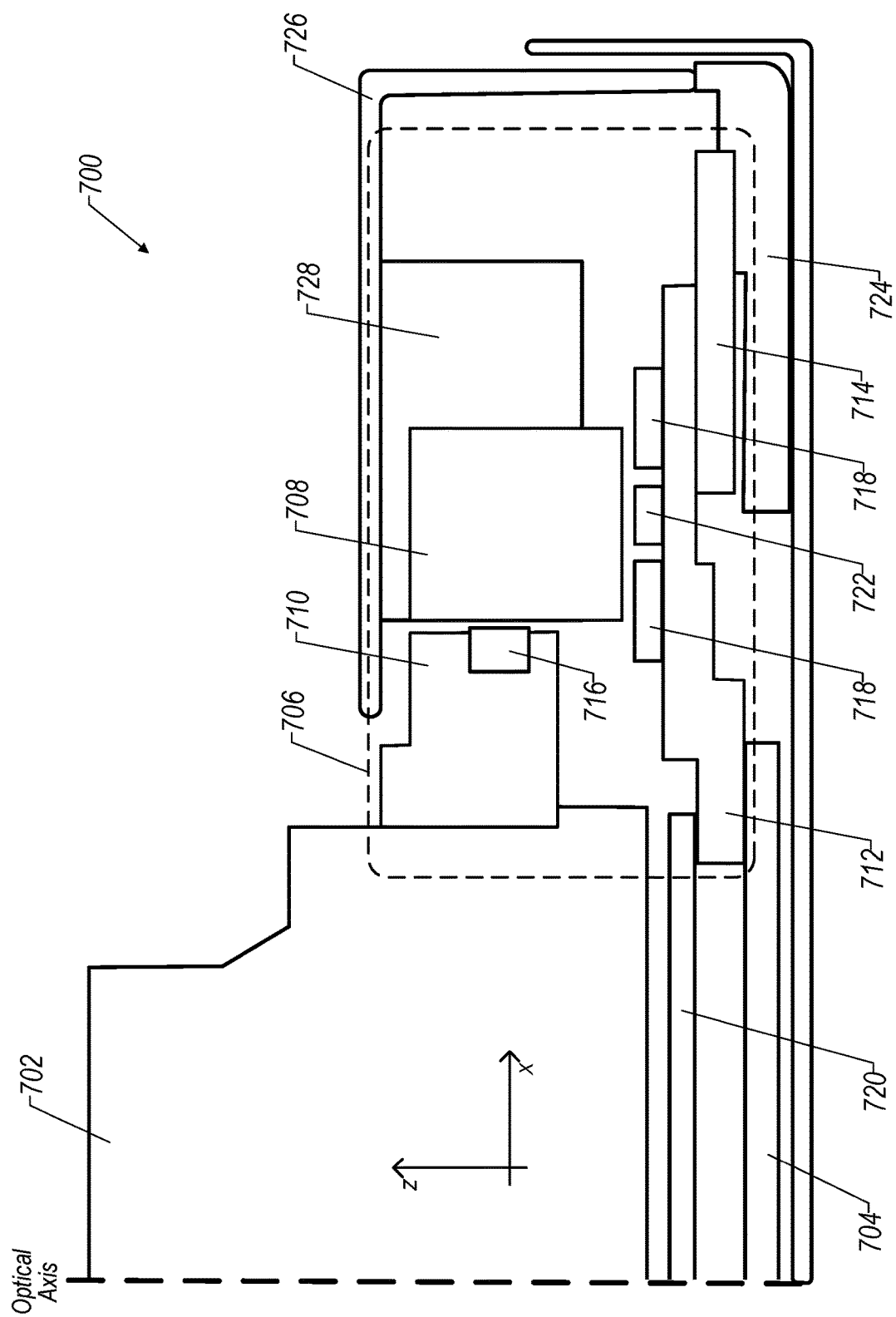
FIG. 7 illustrates a schematic cross-sectional side view of a portion of an example camera that may include one or more actuators and a sensor shift flexure arrangement for improved signal routing, in accordance with some embodiments.

In various embodiments, the sensor shift flexure arrangement 500a (FIG. 5A) may comprise layers of material that are stacked in a direction orthogonal to an image plane of an image sensor (e.g., the image sensor included in the image sensor package 104 in FIG. 1, image sensor 704 in FIG. 7, etc.), e.g., as indicated in the schematic diagram of layers 502-510. According to various embodiments, the stack-up of layers may include a base layer 502, one or more intermediate layers (e.g., comprising adhesion layer 504 and/or dielectric layer 506, a seed layer 508, and a conductive layer 510.

In some embodiments, the conductive layer 510 may form one or more electrical traces used to convey electrical signals and/or power. Furthermore, the base layer 502 may comprise an electrical grounding portion that is used in a ground current return path. For example, the sensor shift flexure arrangement 500a may include a via 512 that extends in a direction (as indicated by arrow 514) orthogonal to the image plane, to convey electrical current from the conductive layer 510 to the electrical grounding portion (e.g., to the base layer 502, as indicated by arrow 516). In some non-limiting examples, the via 512 (and/or one or more other vias) may be located at the inner frame (e.g., inner frame 202 in FIG. 2) and/or the outer frame (e.g., outer frame 204 in FIG. 2) of the flexure.

In various embodiments, the sensor shift flexure arrangement 500b (FIG. 5B) may comprise layers of material that are stacked in the direction orthogonal to the image plane, e.g., as indicated in the schematic diagram of layers 518-528. According to various embodiments, the stack-up of layers may include a base layer 518, a first conductive layer 520, one or more intermediate layers (e.g., comprising adhesion layer 522 and/or dielectric layer 524), a seed layer 526, and a second conductive layer 528.

In some embodiments, the second conductive layer 528 may form one or more electrical traces used to convey electrical signals and/or power. Furthermore, the base layer 518 and the first conductive layer may comprise an electrical grounding portion that is used in a ground current return path. For example, the sensor shift flexure arrangement 500b may include a via 530 that extends in a direction (as indicated by arrow 532) orthogonal to the image plane, to convey electrical current from the second conductive layer 528 to the electrical grounding portion (e.g., to the first conductive layer 520 and/or to the base layer 518, as indicated by arrows 534 and 536). In some non-limiting examples, the via 530 (and/or one or more other vias) may be located at the inner frame (e.g., inner frame 202 in FIG. 2) and/or the outer frame (e.g., outer frame 204 in FIG. 2) of the flexure.

As previously discussed, the sensor shift flexure arrangement 500a (FIG. 5A) does not include an additional conductive layer that is similar to the first conductive layer 520 of the sensor shift flexure arrangement 500b (FIG. 5B). By adding a highly conductive and relatively thin ground plane, such as the first conductive layer 520, to the electrical grounding portion comprising the base layer (which may be designed to provide sufficient stiffness for suspending the image sensor from the stationary structure(s), and which may comprise a metal alloy having a relatively low conductivity), the overall resistivity of the electrical grounding portion and/or the ground current return path may be reduced. Signal routing performance of the flexure may be improved without impacting the mechanical stiffness requirements for the sensor shift flexure. For example, reduced ground direct current resistivity (DCR) may result in lower voltage drop of the camera module power rails in some examples. Furthermore, improved ground impedance and alternating current (AC) return path may reduce camera module to camera module variation in image quality performance in some examples. Furthermore, the lower voltage drop may improve camera module thermals, which may result in relatively higher streaming times in some examples.

According to some embodiments, base layer 502 and/or base layer 518 may be configured to provide sufficient rigidity so that the sensor shift flexure is capable of suspending an image sensor package from a stationary structure of the camera. Furthermore, at least a portion of base layer 502 and/or base layer 518 (e.g., a portion of the base layer used to form the flexure arm(s)) may be configured to have sufficient compliance for allowing motion of the image sensor in the direction(s) enabled by the actuator.

In some non-limiting embodiments, base layer 502 and/or base layer 518 may comprise a nickel-cobalt (NiCo) alloy and/or a copper titanium (CuTi) alloy (e.g., having an electrical conductivity of 10%-40% International Annealed Copper Standard (IACS)). In some embodiments, base layer 502 and/or base layer 518 may comprise electro-formed NiCo for areas of the flexure portion 302, to increase rigidity in those areas. Furthermore, base layer 502 and/or base layer 518 may have a thickness, in the direction orthogonal to the image plane, ranging from 30 um to 150 um.

According to various embodiments, conductive layer 520 may be positioned adjacent base layer 518. In some embodiments, first conductive layer 520 may comprise copper. For example, first conductive layer 520 may comprise electroplated copper. Furthermore, first conductive layer 520 may have a thickness, in the direction orthogonal to the image plane, ranging from 2 um to 30 um in some embodiments.

In some embodiments, adhesion layer 504 in FIG. 5A may be positioned, in the direction orthogonal to the image plane, adjacent base layer 502 (e.g., between base layer 502 and dielectric layer 506). Adhesion layer 522 in FIG. 5B may be positioned adjacent first conductive layer 520 (e.g., between first conductive layer 520 and dielectric layer 524). According to some embodiments, adhesion layer 504 and/or adhesion layer 522 may comprise chromium (e.g., physical vapor deposited (PVD) chromium). Furthermore, adhesion layer 504 and/or adhesion layer 522 may have a thickness, in the direction orthogonal to the image plane, ranging from 50 nm to 200 nm in some embodiments.

In some embodiments, dielectric layer 506 in FIG. 5A may be positioned, in the direction orthogonal to the image plane, between adhesion layer 504 and seed layer 508 (e.g., adjacent adhesion layer 504 and seed layer 508). Dielectric layer 524 in FIG. 5B may be positioned, in the direction orthogonal to the image plane, between adhesion layer 522 and seed layer 526 (e.g., adjacent adhesion layer 522 and seed layer 526). According to some embodiments, dielectric layer 506 and/or dielectric layer 524 may comprise polyimide (e.g., photosensitive polyimide) and/or a build-up film (e.g., a dry insulation build-up film), etc. Furthermore, dielectric layer 506 and/or dielectric layer 524 may have a thickness, in the direction orthogonal to the image plane, ranging from 8 um to 14 um in some embodiments.

In some embodiments, seed layer 508 in FIG. 5A may be positioned, in the direction orthogonal to the image plane, between dielectric layer 506 and conductive layer 510 (e.g., adjacent dielectric layer 506 and conductive layer 510). Seed layer 526 in FIG. 5B may be positioned, in the direction orthogonal to the image plane, between dielectric layer 524 and second conductive layer 528 (e.g., adjacent dielectric layer 524 and second conductive layer 528). According to some embodiments, seed layer 508 and/or seed layer 526 may comprise chromium (e.g., physical vapor deposited (PVD) chromium). Furthermore, seed layer 508 and/or seed layer 526 may have a thickness, in the direction orthogonal to the image plane, ranging from 50 nm to 200 nm in some embodiments.

In some embodiments, conductive layer 510 in FIG. 5A may be positioned, in the direction orthogonal to the image plane, adjacent seed layer 508. Second conductive layer 528 in FIG. 5B may be positioned, in the direction orthogonal to the image plane, adjacent seed layer 526. According to some embodiments, conductive layer 510 and/or conductive layer 528 may comprise copper. For example, conductive layer 510 and/or conductive layer 528 may comprise electroplated copper. Furthermore, conductive layer 510 and/or conductive layer 528 may have a thickness, in the direction orthogonal to the image plane, ranging from 2 um to 30 um in some embodiments.

Figure 6A:
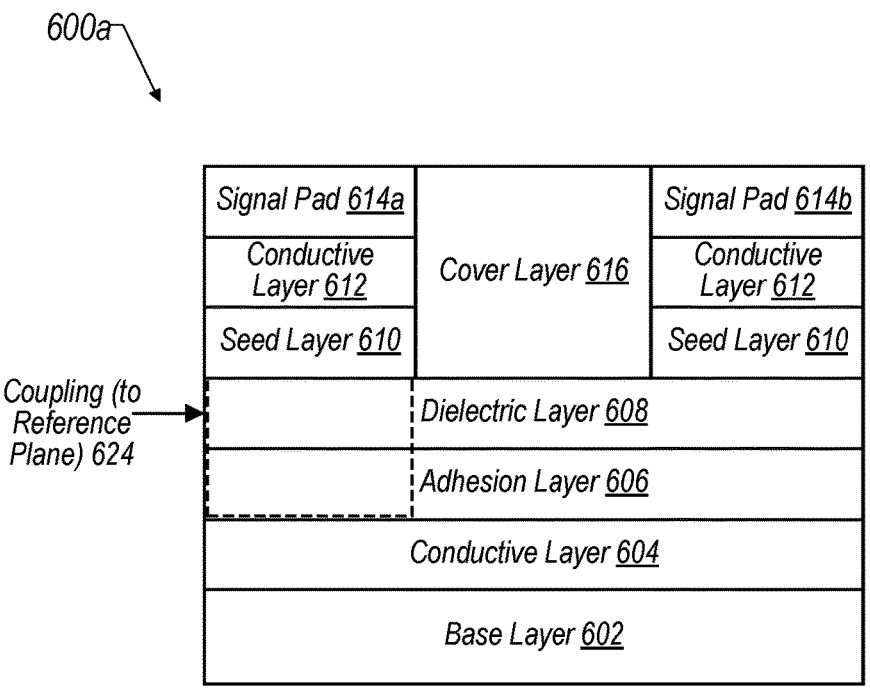
FIGS. 6A-6D illustrate schematic diagrams of example stacks of layers that may be included in sensor shift flexure arrangements.
Figure 6B:
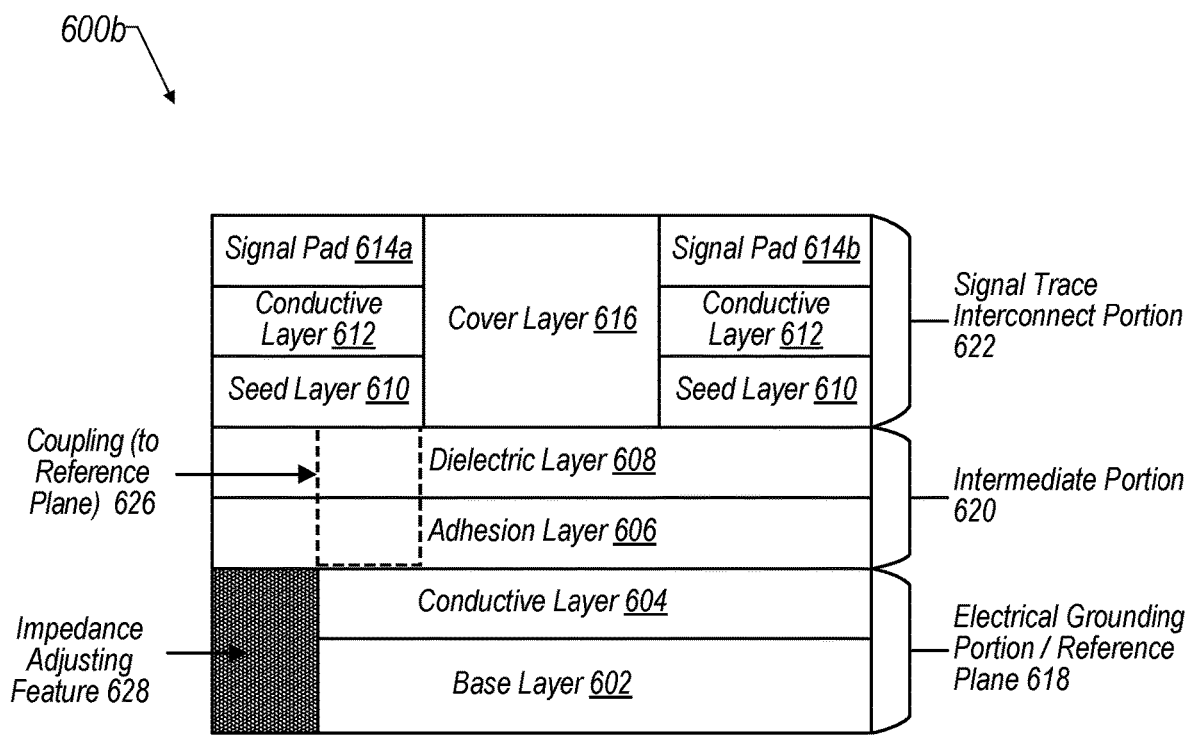
Figure 6C:
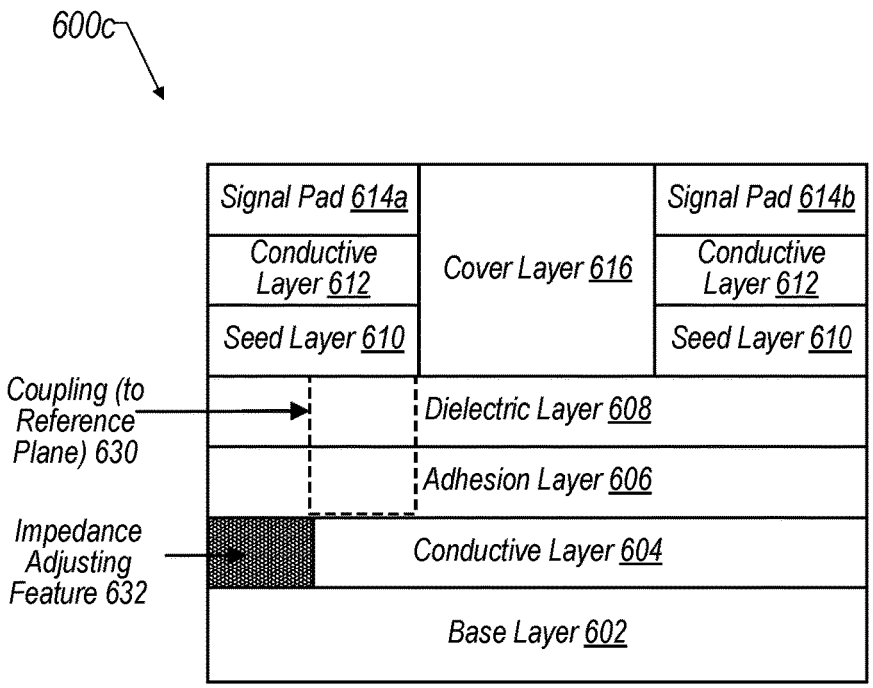
Figure 6D:
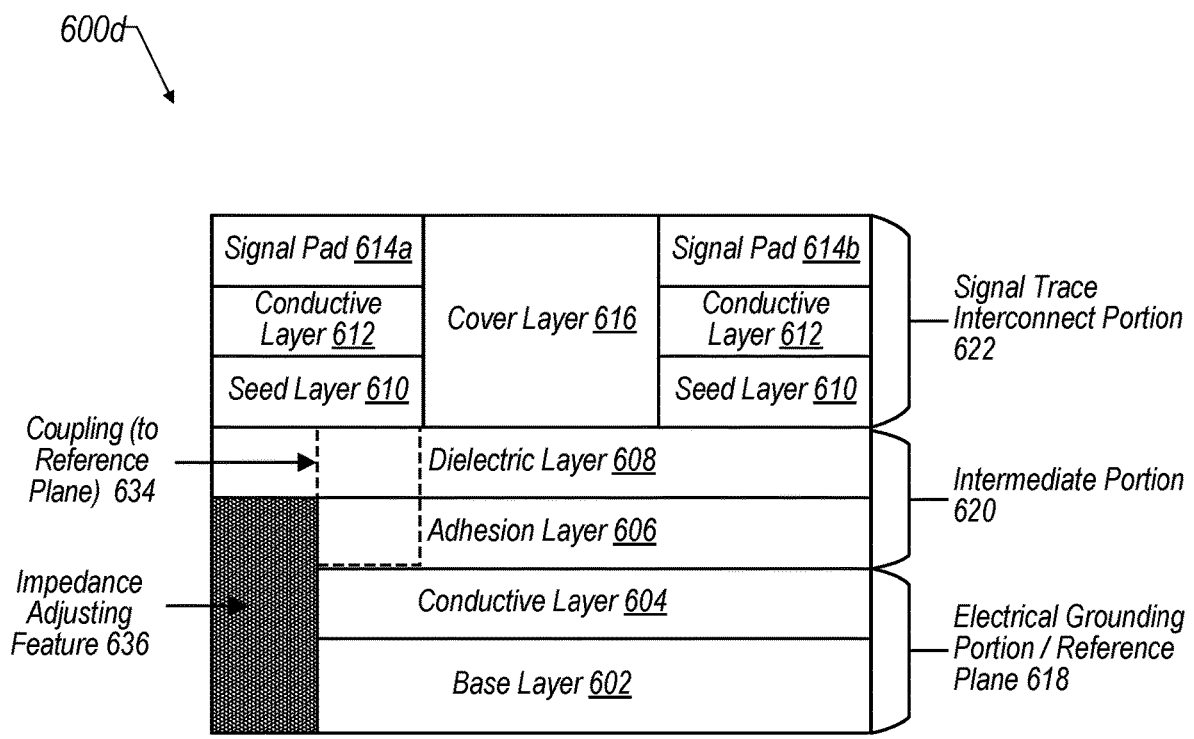

FIGS. 6A-6D illustrate schematic diagrams of example sensor shift flexure arrangements. FIG. 6A shows an example sensor shift flexure arrangement 600a comprising a stack of layers that does not include an impedance adjusting feature. FIGS. 6B-6D show other example sensor shift flexure arrangements 600b-600d comprising a stack of layers that includes an impedance adjusting feature, in accordance with some embodiments. As discussed herein, one or more impedance adjusting features may be used to adjust (e.g., increase) the impedance of electrical signal pads used to interconnect the flexure with other components, e.g., to better match pad impedance to channel impedance requirements, which may enable various signal routing improvements. FIGS. 6B-6D provide non-limiting examples of how the size of the electrical coupling area (e.g., the area between an electrical signal pad and the reference plane) may be reduced by employing the impedance adjusting feature (e.g., a region where a portion of the conductive layer and/or the base layer is removed). The coupling area affects impedance at the signal pad. By appropriately sizing the impedance adjusting feature the coupling area, and thus the signal pad impedance, can be tuned. For example, it may be desirable to tune the signal pad impedance to match the impedance of a signal interconnect (trace) connecting to the signal pad.

In various embodiments, each of the sensor shift flexure arrangements 600a-600d may comprise layers of material that are stacked in a direction orthogonal to an image plane of an image sensor (e.g., the image sensor included in the image sensor package 104 in FIG. 1, image sensor 704 in FIG. 7, etc.). According to various embodiments, the stack-up of layers may include a base layer 602, a first conductive layer 604, an adhesion layer 606, a dielectric layer 608, a seed layer 610, and/or a second conductive layer 612. These layers may have characteristics that are the same as, or similar to, the layers in the stack-ups described herein with reference to FIGS. 4-5B. While first conductive layer 604 is included in FIGS. 6A-6B (like in the stack-ups shown in FIGS. 4 and 5B), it should be appreciated that in various embodiments the first conductive layer may not be included (like in the stack-up shown in FIG. 5A, where the adhesion layer 504 is adjacent the base layer 502).

Furthermore, the sensor shift flexure arrangements 600a-600d may include one or more electrical signal pads 614 (e.g., high-speed signal pads and/or electroless nickel immersion gold (ENIG) pads, etc.). In some embodiments, one or more portions of the sensor shift flexure arrangements 600a-600d may include a cover layer 616 (e.g., polyimide, a Flex-finer material, etc.), such as the one positioned, in a direction parallel to the image plane, between signal pad 614a and signal pad 614b. In some embodiments, the cover layer 616 may cover conductive layer 612 in certain portions of the flexure, e.g., such that the covered portions of conductive layer 612 are sandwiched between the cover layer 616 and one or more other layers (e.g., the seed layer 610).

As indicated in FIG. 6B, in some embodiments the base layer 602 and the conductive layer 604 (or, in some examples, just the base layer 602) may comprise an electrical grounding portion 618 (which may comprise a reference plane), e.g., as also discussed herein with reference to FIGS. 4-5B. The adhesion layer 606 and/or the dielectric layer 608 may comprise an intermediate portion 620, e.g., as similarly discussed herein with reference to FIGS. 4-5B. The seed layer 610, the conductive layer 612 and/or the electrical signal pad(s) 614 may comprise a signal trace interconnect portion 622 that may be used to interconnect signal traces on the flexure with one or more other components, e.g., as discussed herein with reference to FIGS. 1-3B.

In some embodiments, the signal trace interconnect portion 622 may be located at the inner frame (e.g., inner frame 202 in FIG. 2) and/or the outer frame (e.g., outer frame 204 in FIG. 2) of the flexure. As a non-limiting example, the signal trace interconnect portion 622 may be located in electrical signal pad region 208 indicated in FIG. 2. For example, electrical signal pad(s) 614 may include an electrical signal pad used for connecting the inner frame of the flexure with an image sensor substrate (and/or another component of the image sensor package), e.g., as does electrical signal pad 312 with respect to connecting flexure 302 to substrate 310 in FIG. 3A. As another non-limiting example, the signal trace interconnect portion 622 may be located in electrical signal pad region 212 indicated in FIG. 2. For example, electrical signal pad(s) 614 may include an electrical signal pad used for connecting the outer frame of the flexure with a flex circuit (and/or one or more other components), e.g., as does electrical signal pad 306 with respect to connecting flexure 302 to flex circuit 304 in FIG. 3A.

In various embodiments, the electrical signal pad(s) 614 may be constrained to a relatively large size of width and/or length by the type of process(es) used for attaching the flexure with other component(s). Non-limiting examples of attachment processes may include an ACF bonding process, an SMT attachment process, and/or a hot bar bonding process, etc. The large size of the electrical signal pad(s) 614 may cause the electrical signal pad(s) 614 to have a relatively low impedance which may result in poor channel performance for electrical signals (e.g., high-speed signals) when there is a mismatch between the impedance of the electrical signal pad(s) 614 and the corresponding signal channel(s) (e.g., the electrical signal trace(s) formed by the conductive layer 612).

As indicated in FIG. 6A, the signal trace interconnect portion 622 of the sensor shift flexure arrangement 600a may have a relatively large amount of coupling 624, via the intermediate portion 620, to electrical grounding portion/reference plane 618. By comparison, as indicated in FIG. 6B, the signal trace interconnect portion 622 of the sensor shift flexure arrangement 600b may have a relatively smaller amount of coupling 626, via the intermediate portion 620, to electrical grounding portion/reference plane 618. The smaller amount of coupling 626 in the sensor shift flexure arrangement 600b may be achieved by including one or more impedance adjusting features (e.g., impedance adjusting feature 628) in the electrical grounding portion/reference plane 618. The impedance adjusting feature 628, for example, may be designed to reduce the amount of coupling and thereby increase the impedance of the electrical signal pad 614a to better match the target channel impedance, thereby enabling time domain reflectometry (TDR) improvements. For example, better matching pad impedance to the channel impedance may help reduce channel return loss. Reducing channel return loss may improve signal integrity. Improving signal integrity may enable a higher bandwidth for the channel. Furthermore, improving signal integrity may help reduce system power consumption, e.g., by reducing signal/power transmitter swing and/or optimizing signal/power receiver equalization needs.

In various embodiments, the impedance adjusting feature 628 may comprise (i) a void (e.g., an empty space) and/or (ii) a cavity that is at least partially filled with an insulating material (e.g., epoxy). In various embodiments, the impedance adjusting feature 628 may be positioned along an axis that intersects with the signal trace interconnect portion 622 whose impedance is being adjusted using the impedance adjusting feature 628. For example, the impedance adjusting feature 628 may be located within a space underneath a given electrical signal pad 614. While FIG. 6B indicates the presence of a single impedance adjusting feature 628, it should be appreciated that multiple discrete impedance adjusting features 628 may be included below the electrical signal pad 614.

In some embodiments, the impedance adjusting feature(s) 628 may be offset from a center of the electrical signal pad 614, e.g., as indicated in FIG. 6B. In some embodiments, the impedance adjusting feature(s) 628 may be centered with the electrical signal pad 614. Characteristics of the impedance adjusting feature(s) 628, such as, but not limited to, size (e.g., depth and/or width), position, location, shape, material, amount of fill, etc., may be determined based at least in part on a predetermined target impedance (for the electrical signal pad(s) 614) that the impedance adjusting feature(s) 628 are designed to achieve, e.g., to match the signal channel impedance requirements, and/or to adjust the impedance of the electrical signal pad(s) to within a threshold impedance value proximity to the signal channel impedance.

In some embodiments, the impedance adjusting feature(s) 628 may comprise a slot formed using one or more subtractive manufacturing processes (e.g., etching and/or lithography, etc.). The slot may have a depth, in the direction orthogonal to the image plane, that extends through at least a portion of the electrical grounding portion/reference plane 618. That is, at least a portion of the electrical grounding portion/reference plane 618 may define the impedance adjusting feature(s) 628. In some embodiments, the depth of the slot may extend through a portion of the first conductive layer 604 or through the whole depth of the first conductive layer 604 without extending into the base layer 602. In some embodiments, the depth of the slot may extend through the first conductive layer 604 and a portion of the base layer 602. In some embodiments, the depth of the slot may extend through the first conductive layer 604 and through the whole depth of the base layer 604. In some embodiments, e.g., where the first conductive layer 604 is not present (such as in FIG. 5A), the depth of the slot may extend through a portion of the base layer 518 or through the whole depth of the base layer 518.

According to some embodiments, the slot may have a width, in a direction parallel to the image plane, that extends a portion of the width of the electrical signal pad 614 or that extends the whole width of the electrical signal pad 614. In various embodiments, the slot may have an outermost periphery, in the direction parallel to the image plane, that is smaller than or equal to the outermost periphery of the electrical signal pad 614. Furthermore, the outermost periphery of the slot may be constrained to a position within the outermost periphery of the electrical signal pad 614, e.g., if both outermost peripheries were projected onto the image plane.

As previously mentioned regarding FIG. 6A, the signal trace interconnect portion 622 of the sensor shift flexure arrangement 600a may have a relatively large amount of coupling 624, via the intermediate portion 620, to electrical grounding portion/reference plane 618. By comparison, as indicated in FIG. 6C, the signal trace interconnect portion 622 of the sensor shift flexure arrangement 600c may have a relatively smaller amount of coupling 630, via the intermediate portion 620, to electrical grounding portion/reference plane 618. The smaller amount of coupling 630 in the sensor shift flexure arrangement 600c may be achieved by including one or more impedance adjusting features (e.g., impedance adjusting feature 632) in the electrical grounding portion/reference plane 618.

In some embodiments, the impedance adjusting feature 632 in FIG. 6C may be a blind pocket formed using an additive manufacturing process, e.g., by plating up the conductive layer 604, except for a portion or all of the space underneath the signal trace interconnect portion 622. In other words, the space at which the conductive layer 604 is not plated up may be the blind pocket/impedance adjusting feature 632. In some non-limiting examples, the impedance adjusting feature 632 may be a blind pocket in the conductive layer 604, between the base layer 602 and the adhesion layer 606, and underneath the signal trace interconnect portion 622.

Characteristics of the impedance adjusting feature 632, such as, but not limited to, size (e.g., depth and/or width), position, location, shape, material, amount of fill, etc., may be determined based at least in part on a predetermined target impedance (for the electrical signal pad(s) 614) that the impedance adjusting feature 632 is designed to achieve, e.g., to match the signal channel impedance requirements, and/or to adjust the impedance of the electrical signal pad(s) to within a threshold impedance value proximity to the signal channel impedance.

As indicated in FIG. 6D, the signal trace interconnect portion 622 of the sensor shift flexure arrangement 600d may have a relatively smaller amount of coupling 634 (as compared to the relatively large amount of coupling 624 in FIG. 6A), via the intermediate portion 620, to electrical grounding portion/reference plane 618. The smaller amount of coupling 630 in the sensor shift flexure arrangement 600d may be achieved by including one or more impedance adjusting features (e.g., impedance adjusting feature 636) in the electrical grounding portion/reference plane 618.

In some embodiments, the impedance adjusting feature 636 in FIG. 6D may be an open pocket formed using a subtractive manufacturing process (e.g., an etching process) that removes one or more portions of the base layer 602, the conductive layer 604, and/or the adhesion layer 606. As a non-limiting example, the open pocket/impedance adjusting feature 636 may be formed during an etching process that also removes other portions of the flexure, e.g., to form flexure arms (e.g., flexure arms 206 in FIG. 2). In some non-limiting examples, the open pocket/impedance adjusting feature 636 may be formed by etching through at least a portion of the base layer 602, the conductive layer, and the adhesion layer 606, underneath the signal trace interconnect portion 622, e.g., as indicated in FIG. 6D.

Characteristics of the impedance adjusting feature 636, such as, but not limited to, size (e.g., depth and/or width), position, location, shape, material, amount of fill, etc., may be determined based at least in part on a predetermined target impedance (for the electrical signal pad(s) 614) that the impedance adjusting feature 636 is designed to achieve, e.g., to match the signal channel impedance requirements, and/or to adjust the impedance of the electrical signal pad(s) to within a threshold impedance value proximity to the signal channel impedance.

FIG. 7 illustrates a schematic cross-sectional side view of a portion of an example camera 700 that may include one or more actuators and a sensor shift flexure arrangement for improved signal routing, in accordance with some embodiments. In some embodiments, camera 700 may include a lens group 702, an image sensor 704, and a voice coil motor (VCM) actuator module 706. The lens group 702 may define an optical axis. The image sensor 704 may be configured to capture light passing through the lens group 702 and convert the captured light into image signals. In some cases, the VCM actuator module 706 may be one of multiple VCM actuator modules of the camera 700. For instance, the camera 700 may include four such VCM actuator modules 706, such as two pairs of VCM actuator modules 706 that oppose one another relative to the lens group 702. The VCM actuator modules 706 may be configured to move the lens group 702 along the optical axis (e.g., in the Z-axis direction, to provide autofocus (AF) functionality) and/or tilt the lens group 702 relative to the optical axis. Furthermore, the VCM actuator module(s) 706 may be configured to move the image sensor 704 in directions orthogonal to the optical axis (e.g., in the X-axis and/or Y-axis directions, to provide optical image stabilization (OIS) functionality).

In various embodiments, the VCM actuator module 706 may include a magnet 708 (e.g., a stationary single pole magnet), a lens holder 710, a substrate 712, a top flexure (not shown), and a bottom flexure 714 (e.g., comprising one or more sensor shift flexure arrangements disclosed herein). In various embodiments, the bottom flexure 714 may be the same as, or similar to, flexure 106 in FIGS. 1-2, flexure 302 in FIG. 3A, and/or flexure-circuit hybrid structure 308 in FIG. 3B. Furthermore, the VCM actuator module 706 may include an AF coil 716 and a bottom sensor positioning (SP) coil 718.

In some embodiments, the lens holder 710 may hold, or otherwise support, the AF coil 716 proximate a side of the magnet 708. The lens holder 710 may be coupled to the lens group 702 such that the lens group 702 shifts together with the lens holder 710.

In various embodiments, the substrate 712 may hold, or otherwise support, the bottom SP coil 718 proximate a bottom side of the magnet 708. The substrate 712 may be coupled to the image sensor 704 such that the image sensor 704 shifts together with the substrate 712. In some embodiments, the substrate 712 may also be coupled with, or may otherwise support, an infrared cut-off filter (IRCF) 720 (and/or one or more other optical elements), e.g., as indicated in FIG. 7.

In some embodiments, the VCM actuator module 706 may include a position sensor 722 (e.g., a Hall sensor) for position detection based on movement of the SP coil 718 in directions orthogonal to the optical axis. For example, the position sensor 722 may be located on the substrate 712 proximate to the SP coil 718.

The flexure 714 may be configured to provide compliance for motion of the substrate 712 in directions orthogonal to the optical axis. Furthermore, the flexure 714 may be configured to suspend the substrate 712 and the image sensor 704 from one or more stationary structures 724 of the camera 700.

The top flexure (not shown) may be configured to mechanically and electrically connect the lens holder 710 to the shield can 726 and/or to one or more other stationary structures (e.g., stationary structure 724). The top flexure may be configured to provide compliance for movement of the lens holder 710 along the optical axis and for tilt of the lens holder 710 relative to the optical axis. The shield can 726 may encase, at least in part, an interior of the camera 700. The shield can 726 may be a stationary component that is static relative to one or more moving components (e.g., the lens holder 710 and substrate 712).

In some embodiments, the stationary magnet 708 may be fixed to a stationary structure (e.g., magnet holder 728). In some examples, each of the AF coil 716 and the SP coil 718 may be a race track coil.

Electromagnetic interaction between the AF coil 716 and the magnet 708 may produce Lorentz forces that cause the lens holder 710 to move along the optical axis and/or to tilt relative to the optical axis. Electromagnetic interaction between the SP coil 718 and the magnet 708 may produce Lorentz forces that cause the substrate 712 to move in directions orthogonal to the optical axis. The lens group 702 may shift together with (e.g., in lockstep with) the lens holder 710. Furthermore, the image sensor 704 may shift together with (e.g., in lockstep with) the substrate 712.

As also discussed herein with reference to FIGS. 1-6B, electrical contacts/connections may allow for electrical signals (e.g., image signals) to be conveyed from the image sensor 704 to a controller (not shown). For instance, the image sensor 704 may be in electrical contact with the substrate 712 via one or more contacts, and thus image signals may be conveyed from the image sensor 704 to the substrate 712. The image signals may be conveyed from the substrate 712 to one or more external components (e.g., external component(s) 314 in FIGS. 3A-3B) via the flexure 714 and a flex circuit (e.g., flex circuit 108 in FIG. 1, flex circuit 304 in FIG. 3A, etc.). According to various examples, electrical contacts/connections may allow for current to be conveyed from the controller to the substrate 712 to drive the SP coil 718.

Figure 8:
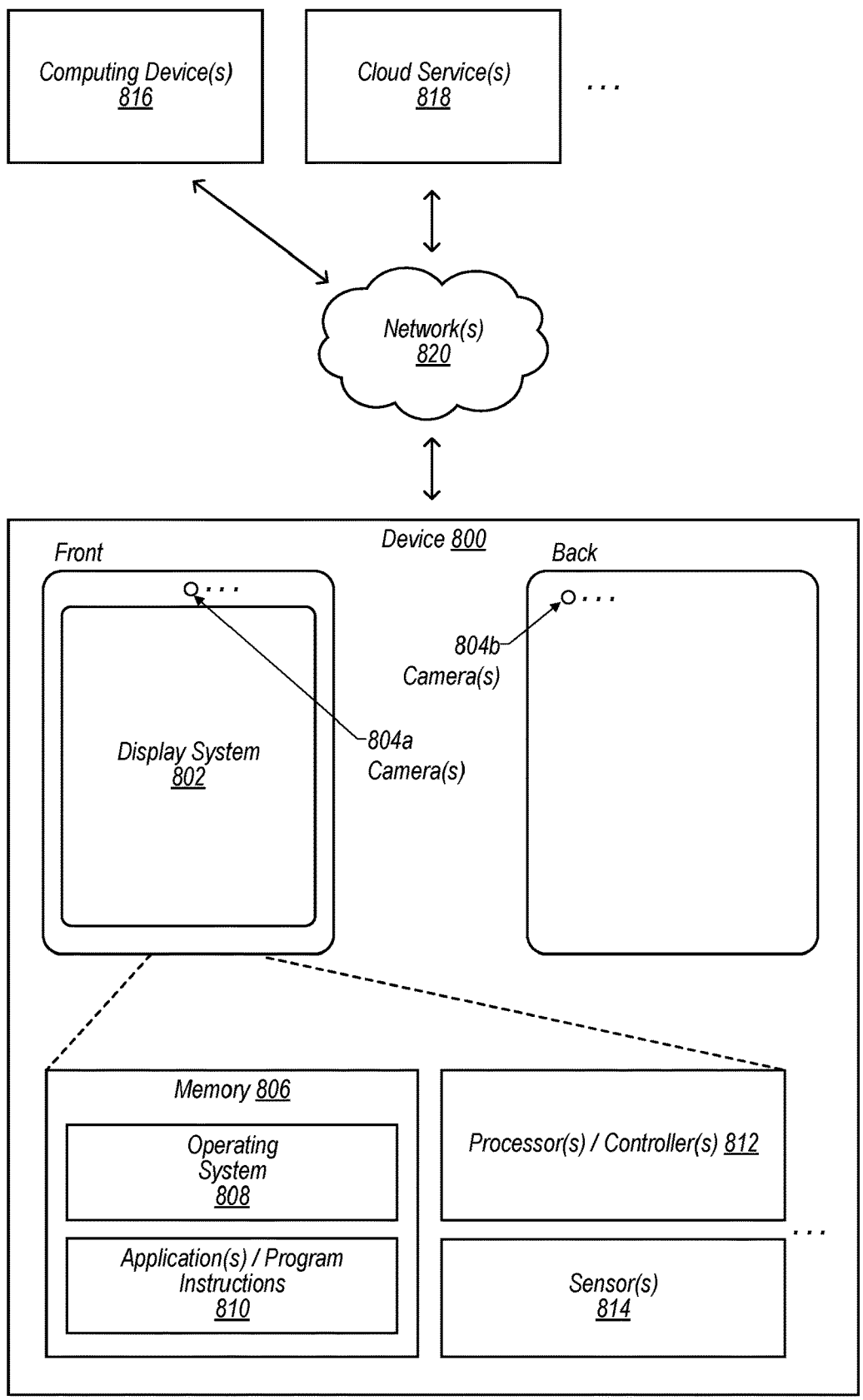
FIG. 8 illustrates a schematic representation of an example device that may include a camera with a sensor shift flexure arrangement for improved signal routing, in accordance with some embodiments.

FIG. 8 illustrates a schematic representation of an example device 800 that may include one or more cameras. For example, the device 800 may include a camera system having a sensor shift flexure arrangement for improved signal routing, such as the camera systems and sensor shift flexure arrangement described herein with reference to FIGS. 1-7. In some embodiments, the device 800 may be a mobile device and/or a multifunction device. In various embodiments, the device 800 may be any of various types of devices, including, but not limited to, a personal computer system, desktop computer, laptop, notebook, tablet, slate, pad, or netbook computer, mainframe computer system, handheld computer, workstation, network computer, a camera, a set top box, a mobile device, an augmented reality (AR) and/or virtual reality (VR) headset, a consumer device, video game console, handheld video game device, application server, storage device, a television, a video recording device, a peripheral device such as a switch, modem, router, or in general any type of computing or electronic device.

In some embodiments, the device 800 may include a display system 802 (e.g., comprising a display and/or a touch-sensitive surface) and/or one or more cameras 804. In some non-limiting embodiments, the display system 802 and/or one or more front-facing cameras 804*a* may be provided at a front side of the device 800, e.g., as indicated in FIG. 8. Additionally, or alternatively, one or more rear-facing cameras 804*b* may be provided at a rear side of the device 800. In some embodiments comprising multiple cameras 804, some or all of the cameras 804 may be the same as, or similar to, each other. Additionally, or alternatively, some or all of the cameras 804 may be different from each other. In various embodiments, the location(s) and/or arrangement(s) of the camera(s) 804 may be different than those indicated in FIG. 8.

Among other things, the device 800 may include memory 806 (e.g., comprising an operating system 808 and/or application(s)/program instructions 810), one or more processors and/or controllers 812 (e.g., comprising CPU(s), memory controller(s), display controller(s), and/or camera controller(s), etc.), and/or one or more sensors 814 (e.g., orientation sensor(s), proximity sensor(s), and/or position sensor(s), etc.). In some embodiments, the device 800 may communicate with one or more other devices and/or services, such as computing device(s) 816, cloud service(s) 818, etc., via one or more networks 820. For example, the device 800 may include a network interface (e.g., network interface 910 in FIG. 9) that enables the device 800 to transmit data to, and receive data from, the network(s) 820. Additionally, or alternatively, the device 800 may be capable of communicating with other devices via wireless communication using any of a variety of communications standards, protocols, and/or technologies.

Figure 9:
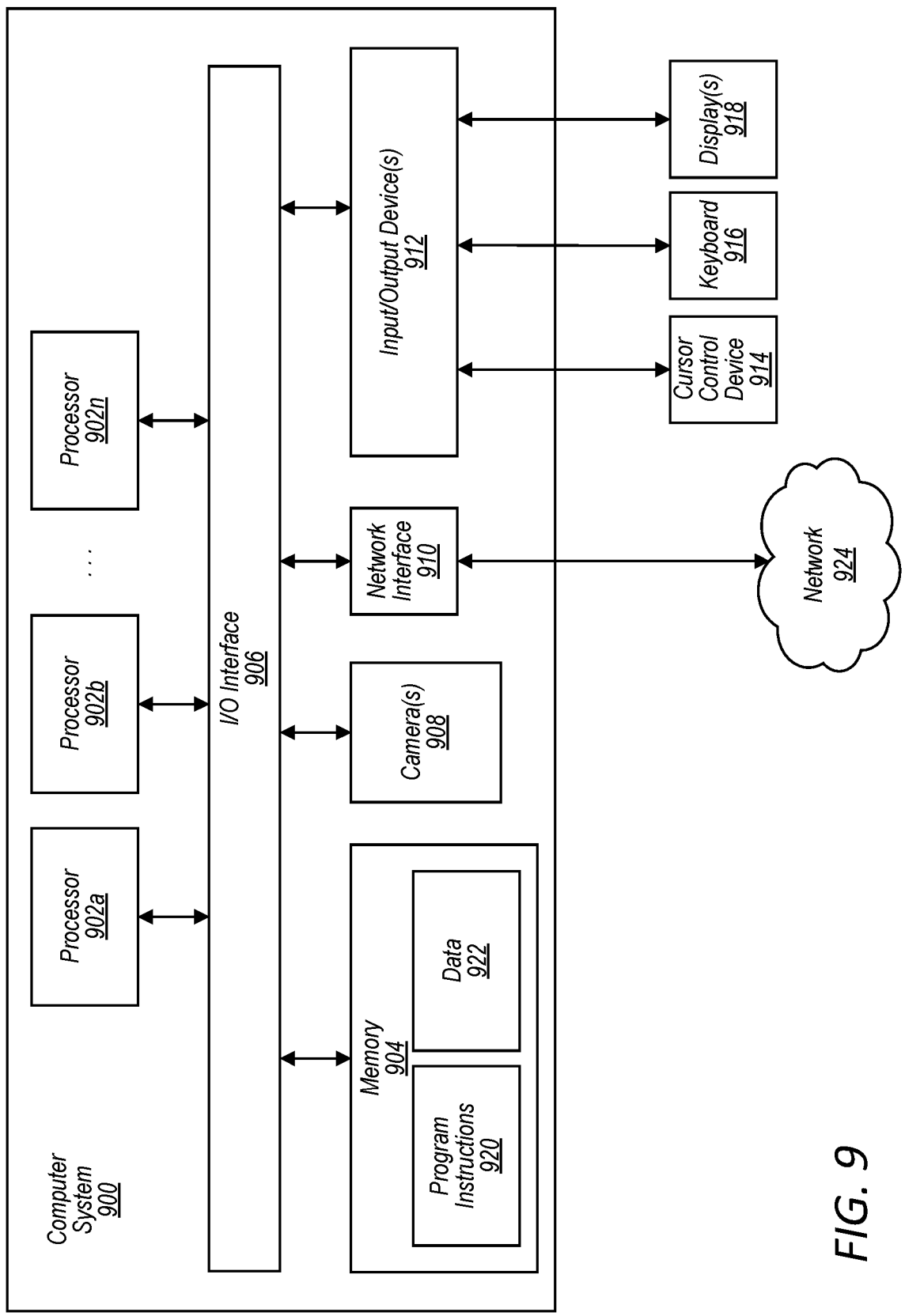
FIG. 9 illustrates a schematic block diagram of an example computer system that may include a camera with a sensor shift flexure arrangement for improved signal routing, in accordance with some embodiments.

FIG. 9 illustrates a schematic block diagram of an example computer system 900 that may include a camera having a sensor shift flexure arrangement for improved signal routing, e.g., as described herein with reference to FIGS. 1-8. In addition, computer system 900 may implement methods for controlling operations of the camera and/or for performing image processing on images captured with the camera. In some embodiments, the device 800 (described herein with reference to FIG. 8) may additionally, or alternatively, include some or all of the functional components of the described herein.

The computer system 900 may be configured to execute any or all of the embodiments described above. In different embodiments, computer system 900 may be any of various types of devices, including, but not limited to, a personal computer system, desktop computer, laptop, notebook, tablet, slate, pad, or netbook computer, mainframe computer system, handheld computer, workstation, network computer, a camera, a set top box, a mobile device, an augmented reality (AR) and/or virtual reality (VR) headset, a consumer device, video game console, handheld video game device, application server, storage device, a television, a video recording device, a peripheral device such as a switch, modem, router, or in general any type of computing or electronic device.

In the illustrated embodiment, computer system 900 includes one or more processors 902 coupled to a system memory 904 via an input/output (I/O) interface 906. Computer system 900 further includes one or more cameras 908 coupled to the I/O interface 906. Computer system 900 further includes a network interface 910 coupled to I/O interface 906, and one or more input/output devices 912, such as cursor control device 914, keyboard 916, and display(s) 918. In some cases, it is contemplated that embodiments may be implemented using a single instance of computer system 900, while in other embodiments multiple such systems, or multiple nodes making up computer system 900, may be configured to host different portions or instances of embodiments. For example, in one embodiment some elements may be implemented via one or more nodes of computer system 900 that are distinct from those nodes implementing other elements.

In various embodiments, computer system 900 may be a uniprocessor system including one processor 902, or a multiprocessor system including several processors 902 (e.g., two, four, eight, or another suitable number). Processors 902 may be any suitable processor capable of executing instructions. For example, in various embodiments processors 902 may be general-purpose or embedded processors implementing any of a variety of instruction set architectures (ISAs), such as the x86, PowerPC, SPARC, or MIPS ISAs, or any other suitable ISA. In multiprocessor systems, each of processors 902 may commonly, but not necessarily, implement the same ISA.

System memory 904 may be configured to store program instructions 920 accessible by processor 902. In various embodiments, system memory 904 may be implemented using any suitable memory technology, such as static random access memory (SRAM), synchronous dynamic RAM (SDRAM), nonvolatile/Flash-type memory, or any other type of memory. Additionally, existing camera control data 922 of memory 904 may include any of the information or data structures described above. In some embodiments, program instructions 920 and/or data 922 may be received, sent or stored upon different types of computer-accessible media or on similar media separate from system memory 904 or computer system 900. In various embodiments, some or all of the functionality described herein may be implemented via such a computer system 900.

In one embodiment, I/O interface 906 may be configured to coordinate I/O traffic between processor 902, system memory 904, and any peripheral devices in the device, including network interface 910 or other peripheral interfaces, such as input/output devices 912. In some embodiments, I/O interface 906 may perform any necessary protocol, timing or other data transformations to convert data signals from one component (e.g., system memory 904 into a format suitable for use by another component (e.g., processor 902). In some embodiments, I/O interface 906 may include support for devices attached through various types of peripheral buses, such as a variant of the Peripheral Component Interconnect (PCI) bus standard or the Universal Serial Bus (USB) standard, for example. In some embodiments, the function of I/O interface 906 may be split into two or more separate components, such as a north bridge and a south bridge, for example. Also, in some embodiments some or all of the functionality of I/O interface 906, such as an interface to system memory 904, may be incorporated directly into processors 902.

Network interface 910 may be configured to allow data to be exchanged between computer system 900 and other devices attached to a network 924 (e.g., carrier or agent devices) or between nodes of computer system 900. Network 924 may in various embodiments include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 910 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output device(s) 912 may, in some embodiments, include one or more display terminals, keyboards, keypads, touchpads, scanning devices, voice or optical recognition devices, or any other devices suitable for entering or accessing data by one or more computer systems 900. Multiple input/output devices 912 may be present in computer system 900 or may be distributed on various nodes of computer system 900. In some embodiments, similar input/output devices may be separate from computer system 900 and may interact with one or more nodes of computer system 900 through a wired or wireless connection, such as over network interface 910.

Those skilled in the art will appreciate that computer system 900 is merely illustrative and is not intended to limit the scope of embodiments. In particular, the computer system and devices may include any combination of hardware or software that can perform the indicated functions, including computers, network devices, Internet appliances, PDAs, wireless phones, pagers, etc. Computer system 900 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 900 may be transmitted to computer system 900 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Generally speaking, a computer-accessible medium may include a non-transitory, computer-readable storage medium or memory medium such as magnetic or optical media, e.g., disk or DVD/CD-ROM, volatile or non-volatile media such as RAM (e.g., SDRAM, DDR, RDRAM, SRAM, etc.), ROM, etc. In some embodiments, a computer-accessible medium may include transmission media or signals such as electrical, electromagnetic, or digital signals, conveyed via a communication medium such as network and/or a wireless link.

The methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

What is claimed is:

1. A camera, comprising:
   a lens group;
   an image sensor;
   an actuator to move the image sensor relative to the lens group; and
   a flexure that suspends the image sensor from a stationary structure of the camera and that allows motion of the image sensor enabled by the actuator, the flexure comprising:
      a plurality of layers stacked in a direction orthogonal to an image plane defined by the image sensor, the plurality of layers comprising:
         an electrical grounding portion, comprising:
            a base layer comprising a metal alloy; and
            a conductive layer adjacent the base layer, wherein the conductive layer provides a ground plane that reduces ground current resistance of the flexure, relative to a ground current resistance of the base layer without the conductive layer.

2. The camera of claim 1, wherein:
   the conductive layer is a first conductive layer; and
   the plurality of layers further comprises:
      a second conductive layer;
      a dielectric layer positioned, in the direction orthogonal to the image plane, between the first conductive layer and the second conductive layer; and
      a via configured to convey electrical current from the second conductive layer to the first conductive layer, wherein the via extends, in the direction orthogonal to the image plane, through the dielectric layer.

3. The camera of claim 1, wherein the conductive layer is a copper layer having a thickness ranging from about 2 microns to about 30 microns.

4. The camera of claim 1, wherein the plurality of layers further comprises:
   a signal trace interconnect portion, comprising:
      an electrical signal pad for attaching the flexure with one or more other components; and
   an intermediate portion, comprising:
      a dielectric layer positioned, in the direction orthogonal to the image plane, between the conductive layer of the electrical grounding portion and the signal trace interconnect portion; and
   wherein a portion of the electrical grounding portion defines an impedance adjusting feature comprising (i) a void or (ii) a cavity that is at least partially filled with an insulating material, and wherein the impedance adjusting feature is positioned along an axis that intersects with the signal trace interconnect portion.

5. The camera of claim 4, wherein:
   the conductive layer is a first conductive layer;
   the intermediate portion comprises:
      an adhesion layer adjacent the first conductive layer; and
      a dielectric layer adjacent the adhesion layer;
   the signal trace interconnect portion further comprises:
      a second conductive layer defining an electrical signal trace;
      wherein the electrical signal pad is positioned adjacent the electrical signal trace; and
   the impedance adjusting feature is configured to increase the impedance of the electrical signal pad to a target impedance that is closer to the impedance of electrical signal trace, relative to an impedance of the electrical signal pad if the flexure did not include the impedance adjusting feature.

6. The camera of claim 5, wherein the impedance adjusting feature is an empty void.

7. The camera of claim 5, wherein the impedance adjusting feature is an epoxy-filled cavity.

8. A device, comprising:
   one or more processors;
   memory storing program instructions executable by the one or more processors to control operations of a camera; and
   the camera, comprising:
      a lens group;
      an image sensor;
      an actuator to move the image sensor relative to the lens group; and
      a flexure that suspends the image sensor from a stationary structure of the camera and that allows motion of the image sensor enabled by the actuator, the flexure comprising:
         a plurality of layers stacked in a direction orthogonal to an image plane defined by the image sensor, the plurality of layers comprising:
            an electrical grounding portion, comprising:
               a base layer comprising a metal alloy; and
               a conductive layer adjacent the base layer, wherein the conductive layer provides a ground plane that reduces ground current resistance of the flexure, relative to a ground current resistance of the base layer without the conductive layer.

9. The device of claim 8, wherein:
   the conductive layer is a first conductive layer; and
   the plurality of layers further comprises:
      a second conductive layer;
      at least one dielectric layer positioned, in the direction orthogonal to the image plane, between the first conductive layer and the second conductive layer; and
      a via configured to convey electrical current from the second conductive layer to the first conductive layer, wherein the via extends, in the direction orthogonal to the image plane, through the at least one dielectric layer.

10. The device of claim 8, wherein the flexure comprises:
an inner frame fixedly coupled with the image sensor;
an outer frame fixedly coupled with the stationary structure of the camera;
one or more flexure arms that are connected to the inner frame and to the outer frame; and
electrical traces on at least a portion of the one or more flexure arms, wherein the electrical traces are configured to convey electrical signals between the inner frame and the outer frame.

11. The device of claim 10, wherein at least one of the inner frame, the outer frame, or the one or more flexure arms comprise the plurality of layers stacked in the direction orthogonal to the image plane.

12. The device of claim 10, wherein the actuator comprises a voice coil motor (VCM) actuator that includes:
a magnet; and
a coil positioned proximate the magnet, such that the coil is capable of electromagnetically interacting with the magnet to produce Lorentz forces that move the image sensor.

13. The device of claim 10, wherein the actuator is configured to move the image sensor in at least one of:
the direction orthogonal to the image plane; or
directions parallel to the image plane.

14. The device of claim 8, wherein:
the base layer has a thickness ranging from 30 microns to 150 microns; and
the conductive layer is a copper layer having a thickness ranging from 2 microns to 30 microns.

15. A camera, comprising:
a lens group;
an image sensor at an image plane;
an actuator to move the image sensor relative to the lens group; and
a flexure that suspends the image sensor from a stationary structure of the camera and that allows motion of the image sensor enabled by the actuator, the flexure comprising:
a plurality of layers stacked in a first direction, the plurality of layers comprising:
an electrical grounding portion, comprising a first conductive layer;
a signal trace interconnect portion, comprising:
an electrical signal pad for attaching the flexure with one or more other components; and
a second conductive layer defining an electrical signal trace;
wherein the electrical signal pad is positioned adjacent the electrical signal trace; and
an intermediate portion, comprising:
a dielectric layer positioned, in the direction orthogonal to the image plane, between the electrical grounding portion and the signal trace interconnect portion;
wherein a portion of the electrical grounding portion defines an impedance adjusting feature comprising (i) a void or (ii) a cavity that is at least partially filled with an insulating material, and wherein the impedance adjusting feature is positioned along an axis that intersects with the signal trace interconnect portion.

16. The camera of claim 15, wherein:
the intermediate portion further comprises:
an adhesion layer adjacent the first conductive layer and the dielectric layer; and
the impedance adjusting feature is configured to increase the impedance of the electrical signal pad to a target impedance that is closer to the impedance of the electrical signal trace, relative to an impedance of the electrical signal pad if the flexure did not include the impedance adjusting feature.

17. The camera of claim 15, wherein the impedance adjusting feature is an empty void.

18. The camera of claim 15, wherein the impedance adjusting feature is an epoxy-filled cavity.

19. The camera of claim 15, wherein the first conductive layer comprises:
a base layer comprising a metal alloy.

20. The camera of claim 15, wherein the electrical grounding portion further comprises:
a base layer comprising a metal alloy;
wherein the first conductive layer is adjacent the base layer, and wherein the conductive layer provides a ground plane that reduces ground current resistance of the flexure, relative to a ground current resistance of the base layer without the conductive layer.

* * * * *